United States Patent
Huang et al.

(10) Patent No.: US 9,314,854 B2
(45) Date of Patent: Apr. 19, 2016

(54) DUCTILE MODE DRILLING METHODS FOR BRITTLE COMPONENTS OF PLASMA PROCESSING APPARATUSES

(71) Applicant: Lam Research Corporation, Fremont, CA (US)

(72) Inventors: Lihua Li Huang, Pleasanton, CA (US);
Duane D. Scott, Centerville, OH (US);
Joseph P. Doench, Mason, OH (US);
Jamie Burns, Richmond, IN (US);
Emily P. Stenta, Lebanon, OH (US);
Gregory R. Bettencourt, Fremont, CA (US); John E. Daugherty, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 223 days.

(21) Appl. No.: 13/754,068

(22) Filed: Jan. 30, 2013

(65) Prior Publication Data
US 2014/0213061 A1    Jul. 31, 2014

(51) Int. Cl.
*H01B 13/00* (2006.01)
*B23B 35/00* (2006.01)
(Continued)

(52) U.S. Cl.
CPC . *B23B 35/00* (2013.01); *B28D 1/14* (2013.01); *B28D 5/021* (2013.01); *H01J 37/3255* (2013.01); *Y10T 29/4973* (2015.01);
(Continued)

(58) Field of Classification Search
CPC .......... H01L 21/34; H01L 21/3065; H01J 37/32633; H01J 37/32532; H01J 37/3255; B24B 3/24; B23D 35/00; B28D 1/14; B28D 5/021

USPC .......... 216/17, 39, 52, 56, 94; 156/345.33, 156/345.34, 345.3; 438/710, 712, 714; 219/121.7, 121.71
See application file for complete search history.

(56) References Cited

U.S. PATENT DOCUMENTS 4,710,642 A   12/1987   McNeil
4,978,567 A   12/1990   Miller
(Continued)

FOREIGN PATENT DOCUMENTS

EP    0600365 A1   6/1994
EP    0803485 A2   10/1997
JP    H9-239639 A   9/1997

OTHER PUBLICATIONS

Egashira, Kai et al., "Micro-drilling of monocrystalline silicon using a cutting tool", Precision Engineering, vol. 26, Issue 3, Jul. 2002, p. 263-268 (Abstract only).
(Continued)

*Primary Examiner* — Lan Vinh
(74) *Attorney, Agent, or Firm* — Buchanan Ingersoll & Rooney

(57) ABSTRACT

A method of drilling holes comprises ductile mode drilling the holes in a component of a plasma processing apparatus with a cutting tool wherein the component is made of a nonmetallic hard and brittle material. The method comprises drilling each hole in the component by controlling a depth of cut while drilling such that a portion of the brittle material undergoes high pressure phase transformation and forms amorphous portions of the brittle material during chip formation. The amorphous portions of the brittle material are removed from each hole such that a wall of each hole formed in the component has an as drilled surface roughness (Ra) of about 0.2 to 0.8 μm.

19 Claims, 4 Drawing Sheets

(51) Int. Cl.
*B28D 1/14* (2006.01)
*B28D 5/02* (2006.01)
*H01J 37/32* (2006.01)

(52) U.S. Cl.
CPC ......... *Y10T 29/49826* (2015.01); *Y10T 408/03* (2015.01); *Y10T 408/04* (2015.01)

(56) References Cited

U.S. PATENT DOCUMENTS

| | | | |
|---|---|---|---|
| 5,643,069 A * | 7/1997 | Christiansen | B24B 5/48 175/387 |
| 5,684,293 A | 11/1997 | Kessler | |
| 5,951,814 A | 9/1999 | Saito et al. | |
| 5,993,594 A | 11/1999 | Wicker et al. | |
| 5,993,597 A | 11/1999 | Saito et al. | |
| 6,310,755 B1 | 10/2001 | Kholodenko et al. | |
| 6,418,921 B1 | 7/2002 | Schmid et al. | |
| 6,436,229 B2 | 8/2002 | Tai et al. | |
| 6,443,817 B1 | 9/2002 | McCarter et al. | |
| 6,805,952 B2 | 10/2004 | Chang et al. | |
| 6,818,097 B2 | 11/2004 | Yamaguchi et al. | |
| 6,858,080 B2 | 2/2005 | Linares et al. | |
| 6,916,503 B2 | 7/2005 | Morikawa et al. | |
| 6,991,521 B2 | 1/2006 | Hagan et al. | |
| 7,002,100 B2 | 2/2006 | Wu et al. | |
| 7,250,114 B2 | 7/2007 | Kiehlbauch et al. | |
| 7,398,014 B1 | 7/2008 | Camm et al. | |
| 7,479,304 B2 | 1/2009 | Sun et al. | |
| 7,507,670 B2 | 3/2009 | Shih et al. | |
| 7,508,116 B2 | 3/2009 | Liu | |
| 7,510,664 B2 | 3/2009 | Carr | |
| 7,662,723 B2 | 2/2010 | Hwang et al. | |
| 7,785,417 B2 | 8/2010 | Ni et al. | |
| 7,869,184 B2 | 1/2011 | Steger | |
| 7,909,549 B2 | 3/2011 | Kondoh et al. | |
| 8,025,731 B2 | 9/2011 | Ni et al. | |
| 8,051,548 B2 | 11/2011 | Miyashita et al. | |
| 8,053,705 B2 | 11/2011 | Shin | |
| 8,206,506 B2 | 6/2012 | Kadkhodayan et al. | |
| 8,216,418 B2 | 7/2012 | Patrick et al. | |
| 8,247,991 B2 | 8/2012 | Huang | |
| 8,277,671 B2 | 10/2012 | Everson et al. | |
| 8,313,610 B2 | 11/2012 | Dhindsa | |
| 8,313,805 B2 | 11/2012 | Kadkhodayan et al. | |
| 2001/0032708 A1 * | 10/2001 | Mishima | H01J 37/32009 156/345.47 |
| 2004/0060920 A1 * | 4/2004 | Ito | H01L 21/67103 219/444.1 |
| 2005/0061447 A1 * | 3/2005 | Kim | H01J 37/32623 156/345.51 |
| 2006/0120816 A1 | 6/2006 | Morimoto et al. | |
| 2007/0108161 A1 | 5/2007 | Murugesh et al. | |
| 2007/0284339 A1 * | 12/2007 | Moore | H01J 37/32467 219/69.17 |
| 2008/0289958 A1 | 11/2008 | Kardokus et al. | |
| 2009/0000742 A1 * | 1/2009 | Okesaku | B24B 1/04 156/345.34 |
| 2009/0087615 A1 * | 4/2009 | Sun | C04B 41/009 428/136 |
| 2010/0041238 A1 | 2/2010 | Cooperberg et al. | |
| 2010/0062214 A1 * | 3/2010 | Wo et al. | 428/131 |
| 2010/0065536 A1 | 3/2010 | Patten | |
| 2010/0120337 A1 | 5/2010 | Kuriyama et al. | |
| 2011/0056626 A1 | 3/2011 | Brown et al. | |
| 2011/0265616 A1 | 11/2011 | Choyke et al. | |
| 2012/0024827 A1 | 2/2012 | Shin | |
| 2012/0039680 A1 | 2/2012 | Koike et al. | |
| 2012/0219930 A1 | 8/2012 | Heinz et al. | |

OTHER PUBLICATIONS

Patten, John A. et al. "The Effects of Laser Heating on the Material Removal Process in Si and SiC Nanomachining", Manufacturing Research Center, Western Michigan University, Kalamazoo, Michigan USA, NFS Grant #0757339, NSF Program Name: CMMI, Proceedings of,2011 NFS Engineering Research and Innovation Conference, Atlanta, GA (11 pgs.), 2011.
Ravindra, Deepak et al., "The Effect of Laser Heating on the Ductile to Brittle Transition of Silicon Carbide", Manufacturing Research Center, Western Michigan University, Kalamazoo, Michigan USA (4 pgs.), Dec. 2, 2014.
Ravindra, Deepak et al., "Ductile Regime Single Point Diamond Turning of Quartz", Manufacturing Research Center, Western Michigan University, Kalamazoo, Michigan USA (6 pgs.).
Ravindra, Deepak et al., "The Effect of Laser Heating on the Ductile to Brittle Transition in Silicon", Manufacturing Research Center, Western Michigan University, Kalamazoo, Michigan USA, ICOMM/4M, 2010 (5 pgs.).
Ravindra, Deepak et al., "Single Point Diamond Turning Effects on Surface Quality and Subsurface Damage to Ceramics", MSEC2009-84113, Proceedings of the ASME 2009 International Manufacturing Science and Engineering Conference, Oct. 4-7, 2009, West Lafayette, Indiana USA (7 pgs.).
Ravindra, Deepak et al., "Ductile regime single point diamond turning of CVD-SiC resulting in an improved and damage-free surface", Mechanical and Aeronautical Engineering, Western Michigan University, Kalamazoo, Michigan 49008 USA (6 pgs.), Dec. 2, 2014.
Shayan, Amir R. et al., Force Analysis, Mechanical Energy and Laser Heating Evaluation of Scratch Tests on Silicon Carbide (4H-Sic) in Micro-Laser Assisted Machining (μ-LAM) Process, MSEC2009-84207, Proceedings of the ASME 2009 International Manufacturing Science and Engineering Conference, Oct. 4-7, 2009, West Lafayette, Indiana USA, Copyright © 2009 by ASME (6 pgs.).
Zhang, Yinxia et al., "Study on Subsurface Damage Model of the Ground Monocrystalline Silicon Wafers", Key Engineering Materials, vol. 416 (2009), www.scientific.net (2009), Trans Tech Publications, Switzerland (Abstract only).
Blake, P.N. et al., "Ductile-Regime Machining of Germanium and Silicon", Journal of the American Ceramic Society, 73(4), pp. 949-957, Apr. 1990 (Abstract Only).
Hung, N.P. et al., "Effect of Crystalline Orientation in the Ductile-Regime Machining of Silicon", International Journal of Advanced Manufacturing Technology (Impact Factor: 1.78), 16(12), pp. 871-876, Sep. 2000 (Abstract Only).
Inamura, T. et al., "Effect of Surface Oxidation on Micromachinability of Monocrystalline Silicon", Cirp Annals-manufacturing Technology, 50(1), pp. 393-396, Jan. 2001 (Abstract Only).
Leung, T.P. et al., "Diamond turning of silicon substrates in ductile-regime", Journal of Materials Processing Technology, vol. 73, Issues 1-3, pp. 42-48, Jan. 1998 (Abstract Only).
Lin, Yan Chemg et al. "Surface modification of Al-Zn-Mg aluminum alloy using the combined process of EDM with USM", Journal of Materials Processing Technology, vol. 115, Issues 3, 24, pp. 359366, Sep. 2001 (Abstract Only).
Ong, N.S. et al., "Semi-ductile grinding and polishing of Pyrex glass", Journal of Materials Processing Technology, vol. 83, Issues 1-3, pp. 261-266, Nov. 1998 (Abstract Only).
Puttick, K.E. et al., "Energy scaling transitions in machining of silicon by diamond", Tribology International, 28(6), pp. 349-355, Jan. 1995 (Abstract Only).

* cited by examiner

DUCTILE MODE DRILLING METHODS FOR BRITTLE COMPONENTS OF PLASMA PROCESSING APPARATUSES

FIELD OF THE INVENTION

The present invention relates to machining components of plasma processing apparatuses and more specifically relates to a method of ductile mode drilling holes in a component of a plasma processing apparatus.

BACKGROUND

In the field of semiconductor material processing, for example, semiconductor material processing apparatuses including vacuum processing chambers are used performing various processes, such as etching and deposition of various materials on substrates, and resist stripping. As semiconductor technology evolves, decreasing transistor sizes call for an ever higher degree of accuracy, repeatability and cleanliness in wafer processes and process equipment. Various types of equipment exist for semiconductor processing, including applications that involve the use of plasmas, such as plasma etch, reactive ion etching, plasma-enhanced chemical vapor deposition (PECVD) and resist strip. The types of equipment required for these processes include components which are disposed within the plasma chamber, and must function in that environment. The environment inside the plasma chamber may include exposure to the plasma, exposure to etchant gasses, and thermal cycling. Materials used for such components must be adapted to withstand the environmental conditions in the chamber, and do so for the processing of many wafers which may include multiple process steps per wafer. To be cost effective, such components must often withstand hundreds or thousands of wafer cycles while retaining their functionality and cleanliness. There is generally extremely low tolerance for components which produce particles, even when those particles are few and no larger than a few tens of nanometers. It is also necessary for components selected for use inside plasma processing chambers to meet these requirements in the most cost-effective manner.

To this end, brittle components which form, for example, a showerhead electrode, are subjected to a mechanical machining operation, such as drilling in order to form process gas delivery holes therethrough. However, the drilling of holes in the brittle component may result in small, nearly invisible microcracks in the surface of the brittle components. These microcracks or subsurface damage can lead to particle contamination due to fracturing of the brittle material.

SUMMARY

Disclosed herein is a method of ductile mode drilling holes in a component of a plasma processing apparatus with a cutting tool wherein the component is made of a nonmetallic hard and brittle material. The method comprises drilling each hole in the component by controlling a depth of cut while drilling such that a portion of the brittle material undergoes high pressure phase transformation and forms an amorphous portion of the brittle material during chip formation. Then amorphous portions of the brittle material are removed from each hole such that a wall of each hole formed in the component has an as drilled surface roughness (Ra) of about 0.2 to 0.8 μm.

BRIEF DESCRIPTION OF THE DRAWING FIGURES

DETAILED DESCRIPTION

Disclosed herein is a method of ductile mode drilling holes in a component of a plasma processing apparatus wherein the component is made of a nonmetallic hard and brittle material and the component comprises holes, such as gas injection holes. As used herein, hard and brittle material means a ceramic, silicon containing (single or polycrystalline silicon containing), or quartz material suitable for use as a component in a semiconductor processing chamber, and more specifically a material which includes quartz, silicon, silicon carbide, silicon nitride, aluminum oxide, aluminum nitride, boron carbide, yttria, zirconia, diamond, or the like. Under normal conditions, semiconductor and ceramic materials are hard and brittle and do not readily plastically deform. Suitable components for use in plasma processing apparatuses are formed from ceramic materials such as silicon and silicon carbide, and quartz materials, and can include showerhead electrodes, gas distribution members, and gas injectors.

To achieve plastic deformation (i.e. ductile mode) of these hard and brittle materials a portion of the surface of the component preferably undergoes a high pressure phase transformation. Ductile mode drilling can take advantage of the small size scale ductile plastic response by controlling the depth of cut, feed rate, peck distance, drill speed, and pressure applied to a portion of the component, such that a portion of the hard and brittle material of the component undergoes a high pressure phase transformation, forming an amorphous portion of the brittle material such that the plastically deformed (amorphous) portions of the brittle material may be removed. The removal of the plastically deformed portions of brittle material forms each hole in the component wherein the component preferably comprises a plurality of holes for delivering a process gas into a processing area of the plasma processing apparatus.

Preferably the as drilled surface roughness of the wall of each hole of the component has a roughness of about 0.2 to 0.8 μm, and more preferably the as drilled surface roughness of the wall of each hole is between about 0.4 to 0.6 μm. As used herein the term "about" refers to ±10%. As used herein the term "surface roughness" is represented as an arithmetic mean value (Ra) for the surface roughness measurement. Preferably, embodiments of methods of ductile mode drilling holes in a component of a plasma processing apparatus will minimize subsurface damage, that is the subsurface damage in the form of microcracks after drilling shall be reduced and the microcracks will preferably extend less than about 20 μm, more preferably less than about 10 μm, and most preferably less than about 5 μm into the brittle component. Ideally, the surface after drilling is nearly entirely fracture free.

Figure 1:
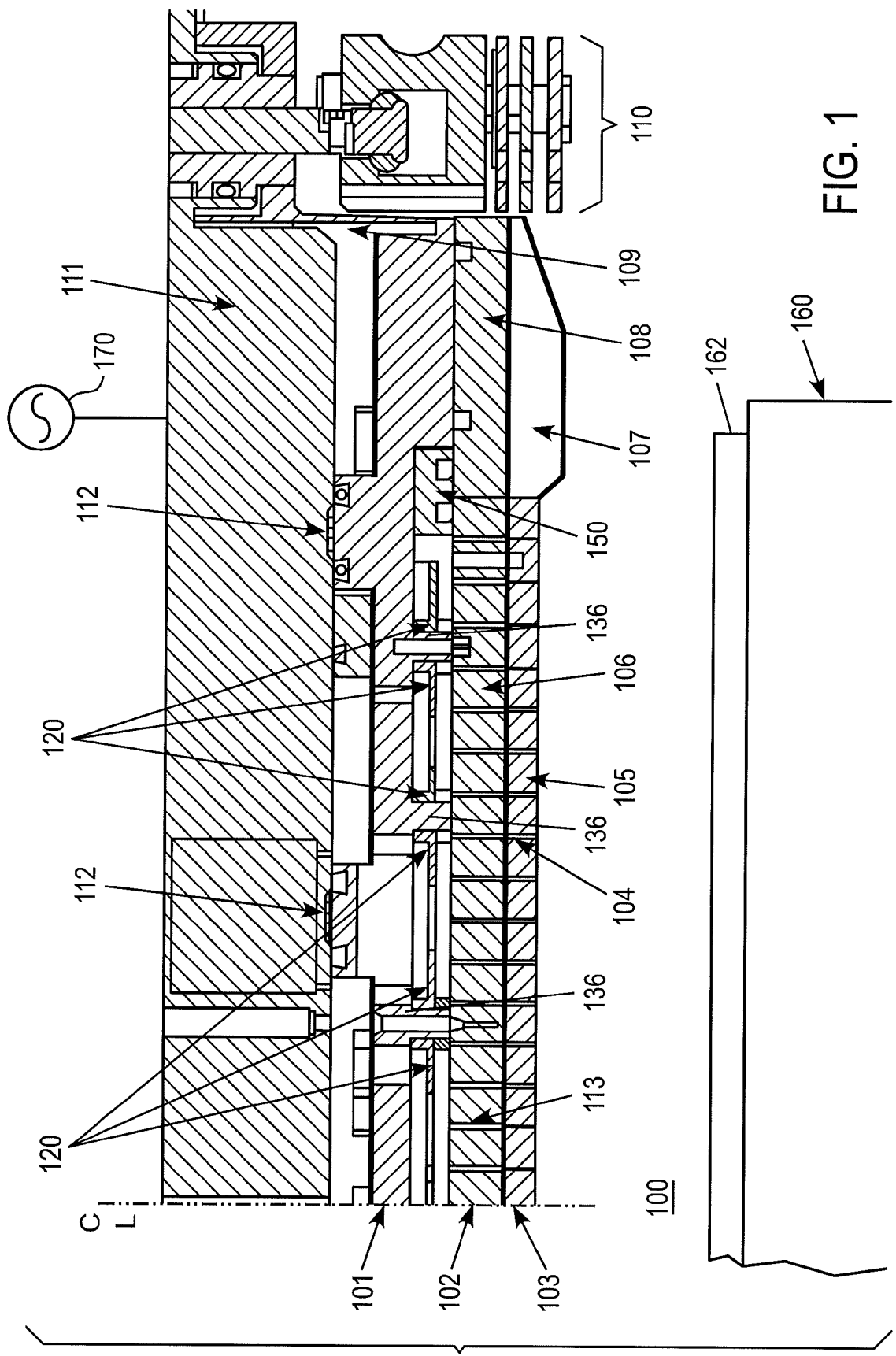
FIG. 1 illustrates an embodiment of a showerhead electrode assembly of a semiconductor plasma processing apparatus.

FIG. 1 depicts one-half of a showerhead assembly 100 of a parallel plate capacitively-coupled plasma chamber (vacuum chamber) comprising a top electrode 103 formed from a nonmetallic hard and brittle material and comprising gas passage holes 104 for delivering process gas therein, and an optional backing member 102 secured to the top electrode 103, a thermal control plate 101, and a top plate 111. The optional backing member 102 can be formed from a nonmetallic hard and brittle material wherein the optional backing member 102 has gas passage holes 113 aligned with the holes 104 in the top electrode for delivering a process gas therethrough. Thermal chokes 112 can be provided on the upper surface of the thermal control plate 101. The top electrode 103 is positioned above a substrate support 160 supporting a semiconductor substrate 162, e.g., semiconductor substrate.

The top plate 111 can form a removable top wall of the plasma processing apparatus, such as a plasma etch chamber. As shown, the top electrode 103 can include an inner electrode member 105, and an optional outer electrode member 107. The inner electrode member 105 is typically made of single crystal silicon. If desired, the inner and outer electrodes 105, 107 can be made of a single piece of material such as CVD silicon carbide, single crystal silicon or other suitable material.

Single crystal silicon is a preferred material for plasma exposed surfaces of the inner electrode member 105 and the outer electrode member 107. High-purity, single crystal silicon minimizes contamination of substrates during plasma processing as it introduces only a minimal amount of undesirable elements into the reaction chamber, and also wears smoothly during plasma processing, thereby minimizing particles.

The showerhead electrode assembly 100 includes holes for delivering process gas therein and can be sized for processing large substrates, such as semiconductor wafers having a diameter of 300 mm. For 300 mm wafers, the top electrode 103 is at least 300 mm in diameter. However, the showerhead electrode assembly can be sized to process other wafer sizes or substrates having a non-circular configuration.

Figure 2:
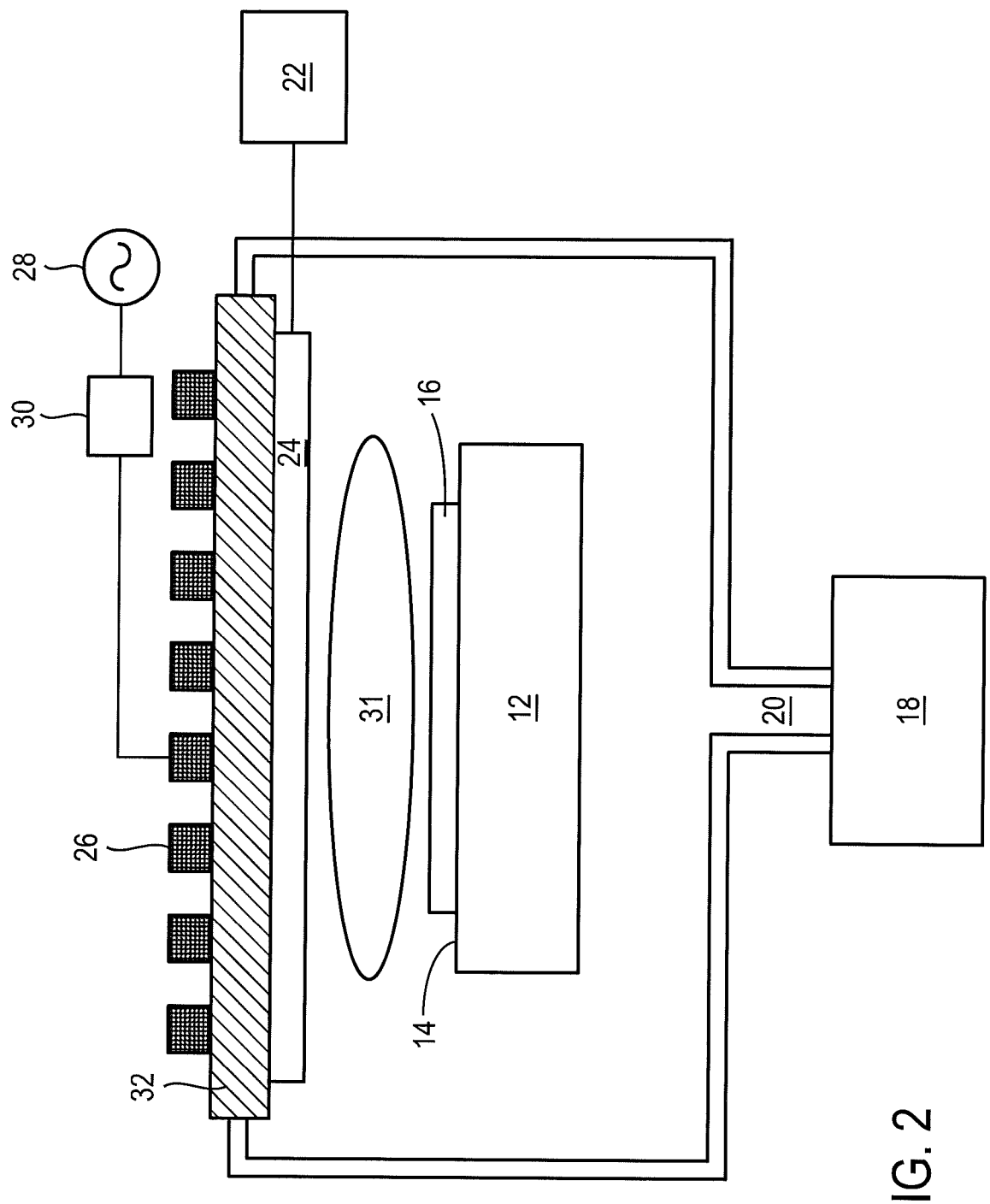
FIG. 2 illustrates an alternate embodiment of a semiconductor plasma processing apparatus.

FIG. 2 is a cross-sectional view of an alternate embodiment of a plasma processing chamber 10 wherein the plasma processing chamber 10 is inductively coupled. An example of an ICP plasma processing chamber is the TCP® etch or deposition system, manufactured by Lam Research Corporation, Fremont, Calif. The ICP plasma processing chamber is also described, for example, in commonly-assigned U.S. Pat. No. 6,805,952, which is incorporated by reference in its entirety. Processing chamber 10 includes a substrate support 12 with support surface 14. The support surface 14 is adapted to support a substrate 16. A vacuum pump 18 is attached to exhaust port 20 to maintain the interior of processing chamber 10 at a low pressure (e.g., between about 1 mTorr to about 50 mTorr). A gas source 22 supplies process gases to the interior of processing chamber 10 through process gas holes comprised in a gas distribution member, a showerhead arrangement, or a gas injector wherein the gas distribution member, the showerhead arrangement, or the gas injector are formed from a nonmetallic hard and brittle material. For example, process gases can be introduced through holes (not shown) in gas distribution member 24 to a zone adjacent to substrate 16.

A dielectric window 32 underlies planar antenna 26 and forms the top wall of plasma processing chamber 10. The gas distribution member 24 is placed below dielectric window 32. High-density plasma 31 is generated in the zone between gas distribution member 24 and substrate 16, for either deposition or etching of substrate 16. Preferably, the dielectric window 32 is formed from a hard and brittle material such as quartz, alumina, aluminum nitride, or silicon nitride. In an alternate embodiment, the dielectric window 32 has a through passage extending therethrough wherein a gas injector may be inserted and provide a process gas to a zone adjacent to substrate 16.

Figure 3A:
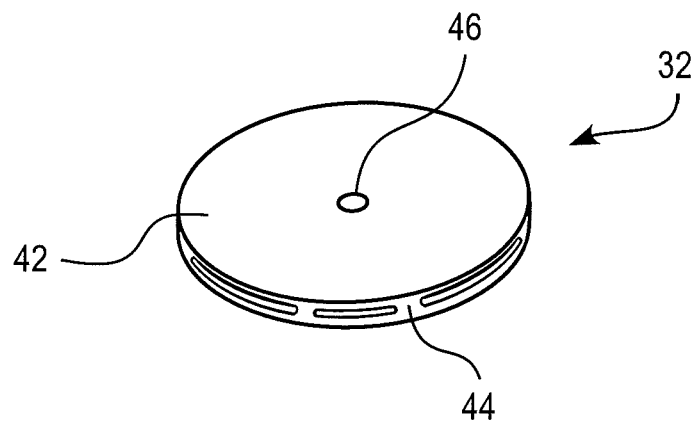
FIGS. 3A, 3B illustrate a dielectric window and gas injector which may include holes formed according to a ductile mode drilling method disclosed herein.
Figure 3B:
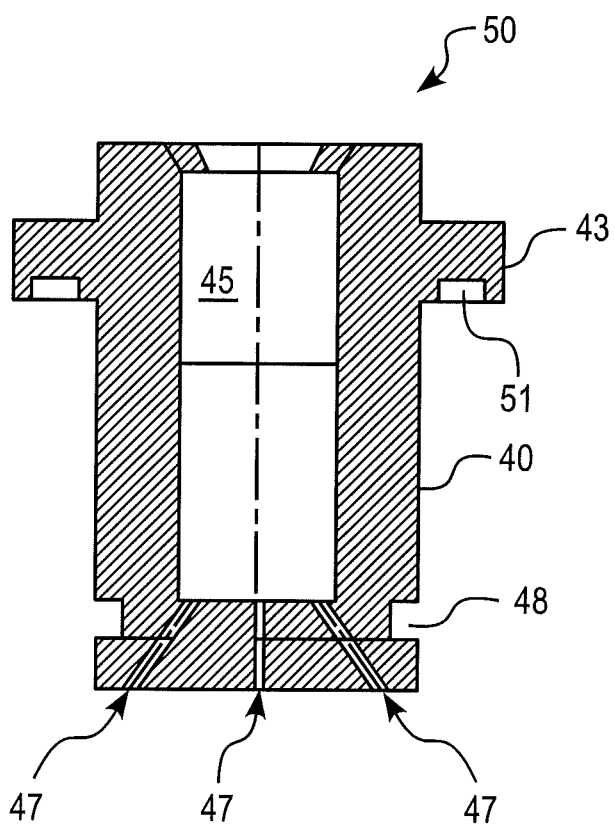

FIG. 3A shows an exemplary dielectric window 32 including parallel planar surfaces 42, a side surface 44, and a through passage 46 configured to support a gas injector 50. Dielectric windows can be made of quartz wherein the quartz may undergo a finishing process. An exemplary finishing process for a dielectric window can be found in commonly-assigned U.S. Pat. No. 7,250,114, which is hereby incorporated by reference in its entirety herein. Alternatively, the dielectric window may be formed from a ceramic material. Preferably the gas injector 50 extends through the through passage 46. As shown in the cross-sectional view of FIG. 3B, the gas injector 50 includes a cylindrical body 40 having a flange 43 at an upper end thereof, a central bore 45 extending through the upper axial end, a plurality of gas holes 47 extending between the bore and the exterior surface of the lower axial end, and O-ring grooves 48, 51. Gas injectors can be made of a dielectric material such as a ceramic or quartz material wherein the gas injector 50 comprises holes 47 for delivering a process gas therethrough. Examples of gas injectors are disclosed in U.S. Pat. Nos. 8,025,731 and 7,785,417, incorporated herein by reference.

Hard and brittle components in plasma processing apparatuses, such as a silicon carbide backing member 102 and a silicon top electrode 103 in the showerhead assembly 100 (see FIG. 1), a gas distribution member 24 placed below dielectric window 32 (see FIG. 2), and a gas injector 50 of the dielectric window 32 (see FIG. 3A and FIG. 3B) will preferably comprise gas passage holes therein. Gas passage holes 104 in the top electrode 103, gas passage holes 113 in the silicon carbide backing member 102, as well as gas passage holes 47 in the gas injector 50 can be formed according to methods of ductile mode drilling disclosed herein. Additionally, gas passage holes (not shown) in the gas distribution member 24 (see FIG. 2) can be formed according to methods of ductile mode drilling disclosed herein. Preferably the holes in the component have a diameter of about 0.2 to 15 mm and more preferably a diameter of about 0.2 to 0.7 mm, such as a diameter of about 0.64 mm, about 0.5 mm, or about 0.43 mm.

The methods of ductile mode drilling disclosed herein may be used to form holes or apertures on any component of a plasma processing apparatus wherein the component is made of a nonmetallic hard and brittle material. The method comprises drilling a hole in the component by controlling depth of cut such that a portion of the brittle material undergoes high pressure phase transformation and forms an amorphous portion of the brittle material during chip formation. The method further comprises removing plastically deformed portions of the brittle material such that a hole is formed in the component. Preferably the as drilled surface roughness of the wall of each hole has a surface roughness of about 0.2 to 0.8 µm, and more preferably the as drilled surface roughness of the wall of each hole is between about 0.4 to 0.6 µm. Preferably the ductile mode drilled holes of the component of nonmetallic hard and brittle material, when formed, will have subsurface damage extending less than about 20 µm, and more preferably extending less than about 10 µm, and most preferably extending less than about 5 µm into the surface of the component.

Preferably during the ductile mode drilling process the nonmetallic hard and brittle material undergoes a high pressure phase transformation during drilling so as to reduce brittle fracture of the material during drilling. Under extremely high pressures, such as those which occur at the contact interface between a drill and the component material, semiconductor, quartz, and ceramic materials transform from covalent and/or ionic bonded structures to high pressure phase transformed metallic structures. For example, it was discovered that high pressure phase transformations found in ductile mode drilling methods disclosed herein converts silicon to a β-Sn crystal structure, as compared to the structure of silicon under normal or low pressure conditions. The pressure provided to form the high pressure phase transformed material should be great enough to overcome the material's hardness. Preferably the ductile mode drilling is performed with a cutting tool such as a diamond drill.

Figure 4:
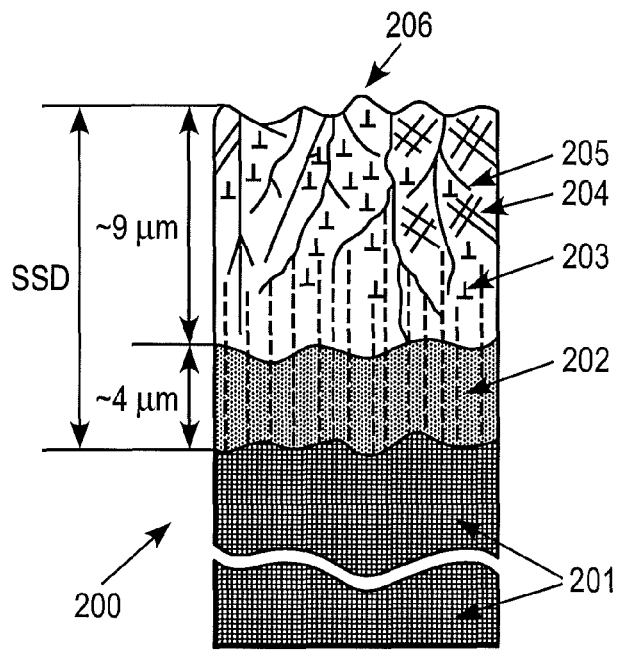
FIG. 4 illustrates a subsurface damage model of a component of nonmetallic hard and brittle material.

FIG. 4 illustrates a subsurface damage model of a component 200 of nonmetallic hard and brittle material such as silicon. As illustrated the component 200 has undergone a high pressure phase transformation wherein an elastically deformed layer 202 is formed above a bulk layer 201. Above the elastically deformed layer 202 is a portion of the component which comprises subsurface damage. The subsurface damage can include dislocations 203 wherein crystalline defects or irregularities may be formed in said component 200 and stacking faults 204 wherein the stacking fault sequence of the crystalline material is interrupted. Microcracks 205 may form and may extend from an upper surface 206 of the component 200 to the elastically deformed layer 202 and potentially therethrough. Preferably, the subsurface damage above the elastically deformed layer 202 extends less than about 10 μm and more preferably less than about 5 μm.

Preferably the ductile mode drilling is performed such that a hole having a diameter of about 0.2 to 15 mm, such as about 0.64 mm, about 0.5 mm, or about 0.43 mm is formed in the nonmetallic hard and brittle material. For example, to reduce the depth of subsurface damage for a hole having a diameter of about 0.4 to 0.8 mm, the ductile mode drilling is preferably performed with a drill speed of about 20,000 to 60,000 revolutions per minute, more preferably performed at about 35,000 to 55,000 revolutions per minute, and most preferably performed at about 40,000 to 50,000 revolutions per minute. The ductile mode drilling preferably has a feed rate of about 0.5 to 1.5 inches per minute, and a peck depth of about 0.001 to 0.004 inch, wherein a depth of cut is less than about 450 nanometers per revolution. Depths of cut greater than 450 nanometers per revolution may lead to drilling in the brittle mode wherein subsurface damage is more likely to occur. More preferably the depth of cut is about 200 to 400 nanometers per revolution. Additionally during the ductile mode drilling, deionized water may be supplied to the drill site to reduce contamination.

Preferably after the holes of the component have been drilled, the component may be cleaned with an acidic solution, such as a mixed acid etch solution (MAE). For example, acid mixtures for etching silicon can be composed of hydrofluoric acid (HF) and nitric acid ($HNO_3$) which are diluted with acetic acid ($CH_3COOH$ or $HC_2H_3O_2$), water or other additives. As is known from the paper by B. Schwartz and H. Robbins, "Chemical Etching of Silicon", J. Electrochem. Soc., Vol. 123, No. 12 (December 1976), pages 1903-1909 (see FIGS. 8 and 9 therein), the composition of the acid mixture determines the etching rate, and also the topological structure of the etched surface or the pattern of the contours produced if etching is carried out with masking. Additionally, exemplary embodiments of acidic solutions and methods for cleaning silicon electrodes, such as a showerhead electrode can also be found in commonly-assigned U.S. Pat. No. 7,507,670 which is hereby incorporated by reference in its entirety herein.

Figure 5:
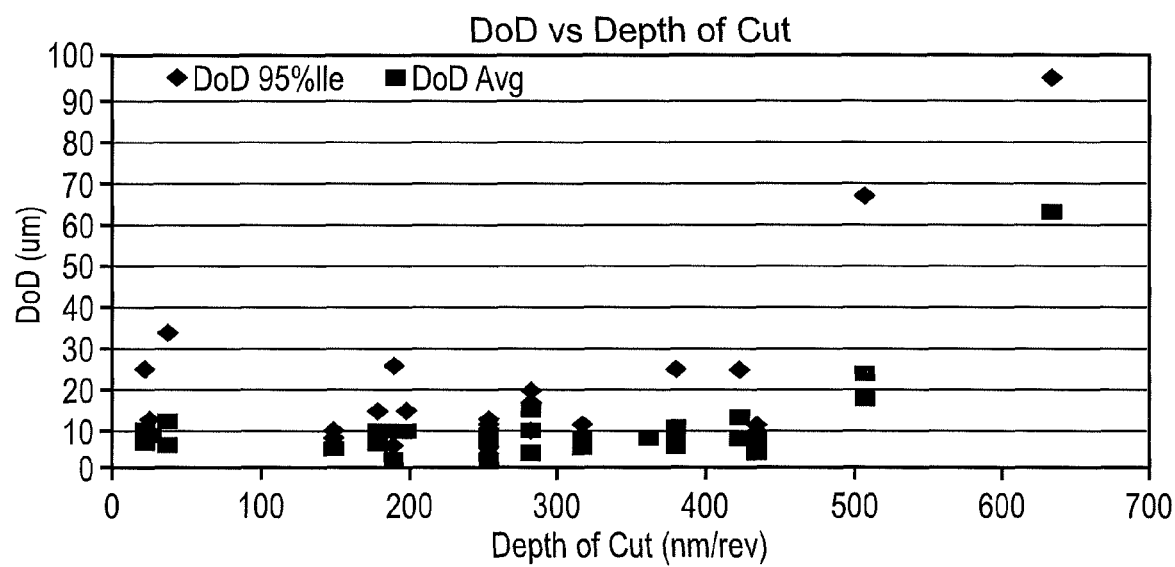
FIG. 5 illustrates a graph comparing depths of the cut with the depth of damage of a wall of a ductile mode drilled hole in a single crystal silicon showerhead electrode.

FIG. 5 illustrates the effects of the depth of cut which is an additional factor in controlling the depth of damage of the ductile mode drilled gas passage holes in a silicon showerhead electrode. Preferably the depth of cut is about 200 and 450 nanometers per revolution to minimize subsurface damage. Depths of cut greater than 450 nanometers per revolution may lead to drilling in the brittle mode wherein subsurface damage is more likely to occur. More preferably the depth of cut is about 200 to 400 nanometers per revolution for minimizing subsurface damage. Depths of cut less than about 200 nanometers per revolution may lead to sporadic subsurface damage, producing results which are less repeatable.

During ductile mode drilling of holes in the component of nonmetallic hard and brittle material, debris may build-up on the cutting tool (drill bit) leading to greater torque, decreased tool life, and reduced process uniformity. Therefore, when drilling more than one hole with the drill bit, it may be desirable to subject the cutting tool to periodic ultrasonic cleaning by immersing the tool in an ultrasonic fluid intermittently between hole drilling operations. Preferably the cutting tool undergoes ultrasonic cleaning after a certain number of holes are drilled, and more preferably, the cutting tool undergoes ultrasonic cleaning after drilling each hole. While not wishing to be bound by theory, up to 99% of the debris built-up on the cutting tool may be removed the instant the cutting tool touches the ultrasonic cleaning fluid. Furthermore, a comprehensive cleaning may be performed on the cutting tool after ductile mode drilling the holes in a predetermined number of components. Preferably the cutting tool undergoes the comprehensive cleaning after ductile mode drilling the holes in each component. The comprehensive cleaning process comprises removing the drill bit, cleaning the drill bit with a caustic soap, and replacing the drill bit.

Further disclosed herein is a method of replacing a component of a plasma processing apparatus comprising. The method comprises removing a used component, such as a showerhead electrode, from the plasma processing apparatus when the used component is eroded; and replacing the used component with a component formed according to methods disclosed herein.

Additionally, disclosed herein is a method of etching a semiconductor substrate in a plasma processing apparatus. The method comprises installing a component formed according to embodiments of methods disclosed herein in a plasma chamber of a plasma processing apparatus, and plasma etching at least one semiconductor substrate in the plasma chamber.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A method of ductile mode drilling holes in a component of a plasma processing apparatus with a cutting tool wherein the component is made of a nonmetallic hard and brittle material comprising:
    drilling each hole in the component by controlling a depth of cut while drilling such that a portion of the brittle material undergoes high pressure phase transformation and forms amorphous portions of the brittle material during chip formation; and
    removing amorphous portions of the brittle material from each hole such that a wall of each hole formed in the component has an as drilled surface roughness (Ra) of about 0.2 to 0.8 μm;
    wherein the component is a silicon or silicon carbide showerhead electrode.

2. The method of claim 1, wherein the hard and brittle material is silicon.

3. The method of claim 1, further comprising cleaning the component with the ductile mode drilled holes with an acidic solution.

4. The method of claim 1, wherein (a) each hole has a diameter of about 0.2 to 15 mm; or (b) each hole has a diameter of about 0.2 to 0.7 mm.

5. The method of claim 1, wherein each hole has a depth of about 5 to 15 mm.

6. The method of claim 1, wherein the component is a showerhead electrode of a plasma etching chamber.

7. The method of claim 1, wherein the cutting tool is diamond drill.

8. The method of claim 1, wherein (a) subsurface damage of each hole extends less than about 20 µm into the wall of the hole; (b) subsurface damage of each hole extends less than about 10 µm into the wall of the hole; or (c) subsurface damage of each hole extends less than about 5 µm into the wall of the hole.

9. The method of claim 1, wherein the as drilled surface roughness of the wall of each hole is between about 0.4 to 0.6 µm.

10. The method of claim 1, wherein deionized water is supplied to the hole during ductile mode drilling.

11. A method of replacing a component of a plasma processing apparatus comprising: removing a used showerhead electrode from the plasma processing apparatus when the used showerhead electrode is eroded; and replacing the used with a showerhead electrode made by the method of claim 1.

12. A method of installing a showerhead electrode in a plasma etching chamber comprising installing the showerhead electrode made by the method of claim 1 in a plasma etching chamber.

13. A method of etching a semiconductor substrate in a plasma processing apparatus, comprising: installing a showerhead electrode made according to the method of claim 1 in a plasma chamber of a plasma processing apparatus; and plasma etching at least one semiconductor substrate in the plasma chamber.

14. The method of claim 1, further comprising subjecting the cutting tool to intermittent ultrasonic cleaning before drilling a new hole in the component while ductile mode drilling the component of a hard and brittle material.

15. The method of claim 14, wherein the cutting tool undergoes ultrasonic cleaning after drilling each hole.

16. The method of claim 14, wherein the cutting tool undergoes a comprehensive cleaning process after ductile mode drilling each component, the comprehensive cleaning process comprising removing the cutting tool, cleaning the cutting tool with a caustic soap, and replacing the cutting tool.

17. A method of ductile mode drilling holes in a component of a plasma processing apparatus with a cutting tool wherein the component is made of a nonmetallic hard and brittle material comprising:

drilling each hole in the component by controlling a depth of cut while drilling such that a portion of the brittle material undergoes high pressure phase transformation and forms amorphous portions of the brittle material during chip formation; and removing amorphous portions of the brittle material from each hole such that a wall of each hole formed in the component has an as drilled surface roughness (Ra) of about 0.2 to 0.8 µm; wherein the ductile mode drilling is performed with a drill speed of about 20,000 to 60,000 revolutions per minute, a feed rate at about 0.5 to 1.5 inches per minute, a peck depth of about 0.001 to 0.004 inch, and a depth of cut less than about 450 nanometers per revolution.

18. The method of claim 17, wherein the depth of cut is about 200 to 400 nanometers per revolution.

19. The method of claim 17, wherein the ductile mode drilling is performed with a drill speed of about 35,000 to 55,000 revolutions per minute.

* * * * *